(12) United States Patent
Teramoto

(10) Patent No.: US 9,977,525 B2
(45) Date of Patent: May 22, 2018

(54) DISPLAY DEVICE AND MANUFACTURING METHOD THEREOF

(71) Applicant: Japan Display Inc., Tokyo (JP)

(72) Inventor: Masahiro Teramoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 124 days.

(21) Appl. No.: 14/712,678

(22) Filed: May 14, 2015

(65) Prior Publication Data

US 2015/0332965 A1 Nov. 19, 2015

(30) Foreign Application Priority Data

May 16, 2014 (JP) ................................ 2014-102333

(51) Int. Cl.
| H01L 21/768 | (2006.01) |
| G06F 3/041 | (2006.01) |
| G06F 3/047 | (2006.01) |
| H01L 21/66 | (2006.01) |
| G06F 3/044 | (2006.01) |

(52) U.S. Cl.
CPC ............ *G06F 3/0412* (2013.01); *G06F 3/044* (2013.01); *G06F 3/047* (2013.01); *G06F 3/0416* (2013.01); *H01L 21/76892* (2013.01); *H01L 22/10* (2013.01); *G06F 2203/04103* (2013.01); *G06F 2203/04112* (2013.01)

(58) Field of Classification Search
USPC ........................................................ 345/174
See application file for complete search history.

(56) References Cited

U.S. PATENT DOCUMENTS

| 2002/0196393 A1* | 12/2002 | Tashiro | ................. G02F 1/1303 349/106 |
| 2013/0188104 A1 | 7/2013 | Aoki et al. | |
| 2015/0242025 A1* | 8/2015 | Cok | ......................... G06F 3/046 29/622 |
| 2016/0252785 A1* | 9/2016 | Kimura | ............... G02F 1/13338 349/12 |

FOREIGN PATENT DOCUMENTS

| JP | 2013-152291 A | 8/2013 |
| JP | 2014-16944 A | 1/2014 |
| WO | 2014/010620 A1 | 1/2014 |

\* cited by examiner

*Primary Examiner* — Jennifer Mehmood
*Assistant Examiner* — Deeprose Subedi
(74) *Attorney, Agent, or Firm* — Typha IP LLC

(57) ABSTRACT

A manufacture method for display device includes the steps of: (a) forming a metal film on a substrate; (b) forming a metal layer by patterning the metal film; and (c) following the step (b) and forming, on the metal layer, a low reflection layer of a resin. The step (b) includes the steps of: (b1) forming an etching protection film; (b2) patterning the etching protection film; and (b3) following the step (b2) and etching the metal film.

6 Claims, 17 Drawing Sheets

DISPLAY DEVICE AND MANUFACTURING METHOD THEREOF

CLAIM OF PRIORITY

The present application claims priority from Japanese patent application JP2014-102333 filed on May 16, 2014, the content of which is hereby incorporated by reference into this application.

BACKGROUND

The present invention relates to a display device and is applicable to, for example, a display device including a touch panel. In a liquid crystal display device incorporating an in-cell touch panel, a back-side transparent conductive film made of a transparent conductive film such as an ITO film and disposed on a second substrate (color filter substrate) is divided into belt-like patterns so as to define detection electrodes for touch panel, while a counter electrode formed in a first substrate (TFT substrate) is divided into belt-like patterns or into a plurality of blocks so as to be made to double as scanning electrodes. Thus, a touch panel substrate is dispensed with (see Japanese Unexamined Patent Application Publication No. 2013-152291 (Patent Literature 1)).

The prior art document related to the present disclosure includes Japanese Unexamined Patent Application Publication No. 2014-16944.

SUMMARY

Wirings of the detection electrodes formed of the ITO film as described in the patent literature 1 have such a high resistance that the detection electrodes are lowered in detection performance as the display device is increased in size and definition.

The other objects and novel features of the invention will become apparent from the description of the present disclosure and the accompanying drawings.

An outline of atypical feature of the present disclosure is briefly described as follows.

Namely, a manufacture method for a display device includes the steps of: (a) forming a metal film on a substrate; (b) forming a metal layer by patterning the metal film; (c) following the step (b) and forming, on the metal layer, a low reflection layer of a resin.

DESCRIPTION OF THE PREFERRED EMBODIMENTS

Figure 1:
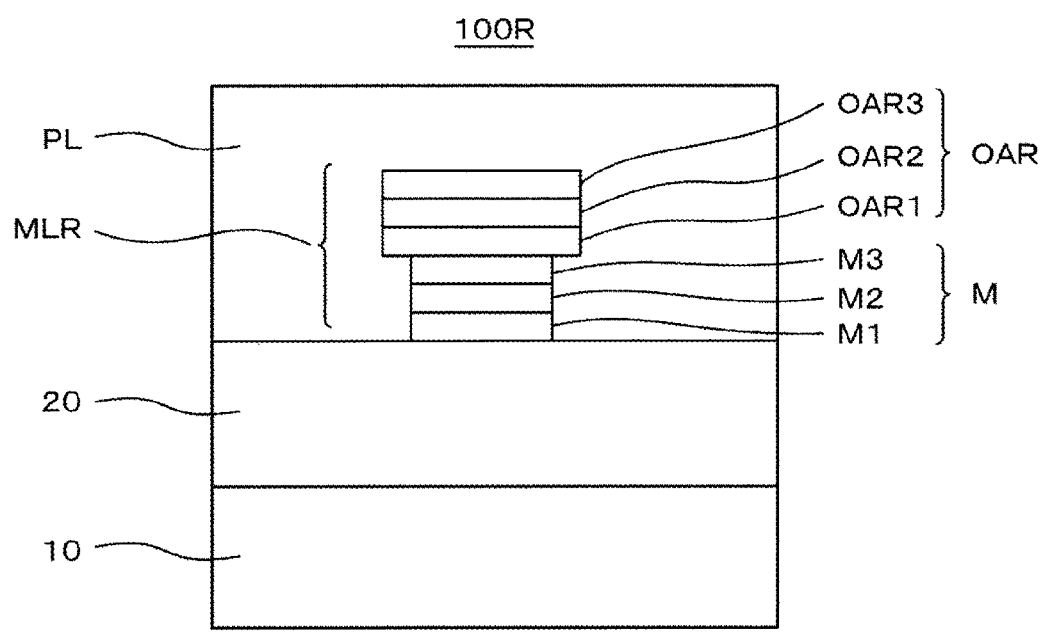
FIG. 1 is a sectional view for illustrating a structure of a display device according to a comparative example.

An embodiment of the invention, a comparative example, a working example and modifications of the invention will hereinbelow be described with reference to the accompanying drawings. It is noted that the disclosed examples are described only for illustrative purpose and various changes and modifications not departing from the scope of the invention and apparent to those skilled in the art should be construed as being included in the invention. While the drawings may schematically illustrate for clarity the width, thickness, shape and the like of the components of the embodiment, those illustrations are just an example but do not mean to limit the interpretation of the invention. In the present description and the accompanying drawings, like reference characters refer to the corresponding components mentioned with reference to the preceding drawings and hence, the detailed description thereof may be omitted as needed.

Comparative Example

Figure 2:
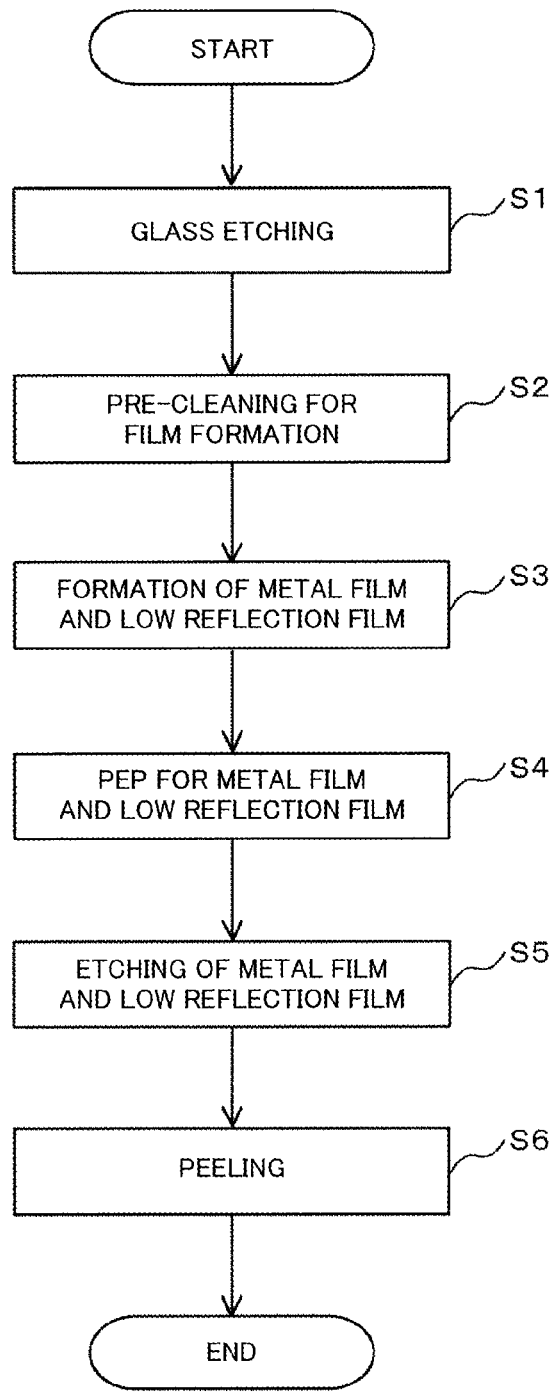
FIG. 2 is a flow chart for illustrating a manufacture method for the display device according to the comparative example.

First, before disclosing the invention, description is made on a studied technique (Comparative Example) with reference to FIG. 1 and FIG. 2.

FIG. 1 is a sectional view for illustrating a structure of a display device according to a comparative example. FIG. 2 is a flow chart for illustrating a manufacture method for the display device according to the comparative example.

The time constant of wiring need be improved to support a large, high-resolution display panel. If an ITO layer is used for detection electrodes for touch panel, it is difficult to obtain an ITO pattern that satisfies both electric characteristic (low resistance) and optical characteristic (least visible ITO pattern, higher transmittance). That is, the use of the ITO layer is unfavorable, resulting in a display panel significantly degraded in the characteristics. In this connection, the inventors have contemplated for forming wiring using a metal layer. By the way, the metal layer has a comparatively high reflectance. Therefore, if external light is reflected by the metal layer constituting the detection electrodes for touch panel, the display panel is lowered in image contrast. Hence, a low reflection layer is disposed on a viewer's side of the metal layer.

A display device 100R according to the comparative example includes an array substrate 10, a counter substrate 20 and a wiring layer MLR. The wiring layer MLR is formed on an upper surface (the opposite side from the array substrate 10) of the counter substrate 20 and includes a metal layer M and a low reflection layer OAR. The metal layer M consists of three layers which include a Mo alloy layer M1, an Al alloy layer M2, and a Mo alloy layer M3. The low reflection layer OAR consists of three layers which include an oxide layer OAR1, a metal alloy layer OAR2, and an oxide layer OAR3. The metal layer M and the low reflection layer OAR are covered with a protection layer PL. The wiring layer MLR is a wiring layer functioning as a detection electrode for in-cell touch panel.

Next, description is made on a manufacture method for the display device 100S according to the comparative example.

A glass substrate constituting the array substrate 10 and a glass substrate constituting the counter substrate 20 are reduced in thickness by etch-polishing (Step S1) and then, are cleaned (Step S2). Subsequently, a metal film and a low reflection film are formed on the glass substrate of the counter substrate 20 (Step S3). Next, a photoresist is patterned by applying the photoresist onto the metal film and the low reflection film, followed by irradiation with light and development (referred to as photolithography or PEP (Photo Engraving Process)) (Step S4). The metal film and the low reflection film are patterned by etching using the photoresist as a mask whereby the metal layer M and the low reflection layer OAR are formed (Step S5). Finally, the photoresist is peeled off (Step S6) and thus, a wiring layer ML for detection electrode is formed. According to the above-described manufacture flow, the wiring can be formed based on the same process flow as that for the ITO film. However, there is another problem that the number of films to form increases from one to six, resulting in the increase in process load. While the low reflection film and the metal film can be collectively processed, it is necessary to set the etching rate for the metal film greater than that for the low reflection film because the metal film is invariably covered with the low reflection film. Therefore, the etched metal film is shielded by the low reflection film so that the metal film cannot be visually inspected. The inspection is indispensable because the risk of disconnection increases due to the microprocessing in combination with the large amount of metal film retreat. Since the visual appearance inspection is unavailable, the disconnection is detected by performing an electrical inspection which requires much time, leading to a significant decrease in productivity. Having only the low reflection layer laid thereon, the metal layer is in an exposed state and thence is increased in the risk of dissolution. This dictates the need to form an additional protection layer for the purpose of ensuring reliability although the protection layer is not provided in the case of ITO film.

Embodiment

Next, a display device according to an embodiment of the invention is described with reference to FIG. 3 and FIG. 4.

Figure 3:
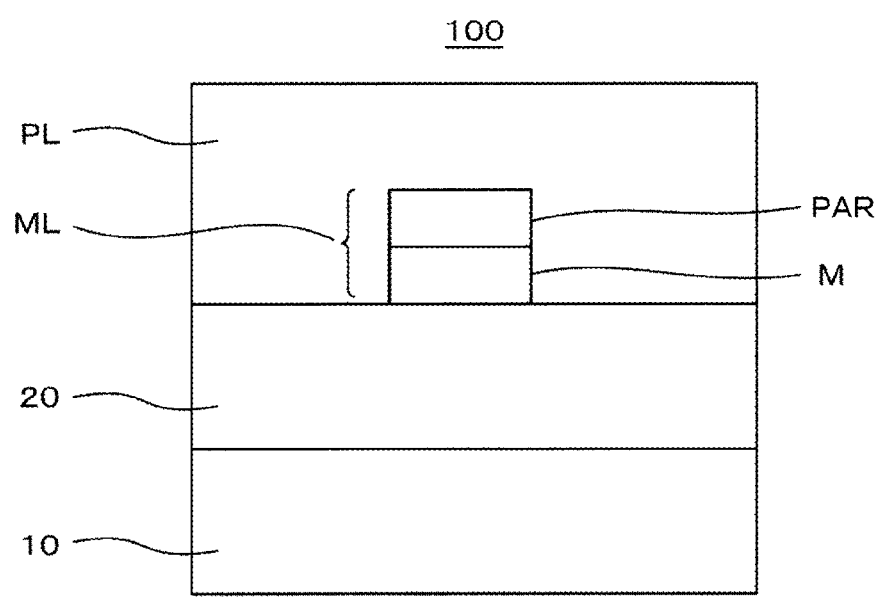
FIG. 3 is a sectional view for illustrating a structure of a display device according to an embodiment of the invention.
Figure 4:
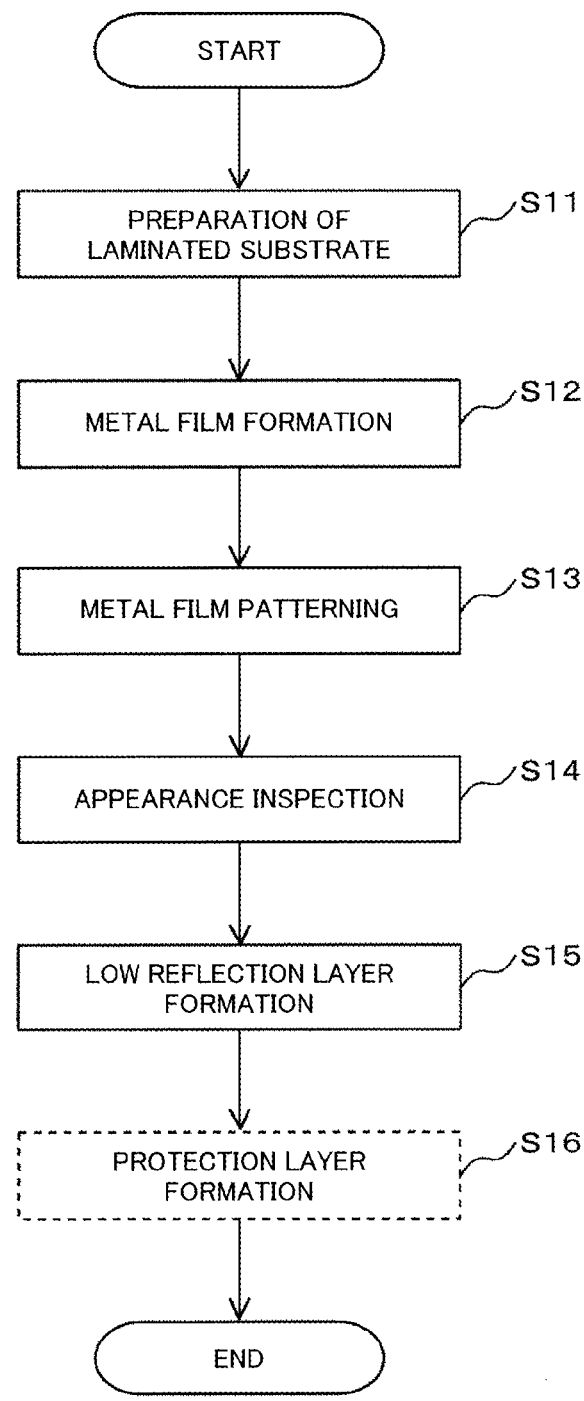
FIG. 4 is a flow chart for illustrating a manufacture method for the display device according to the embodiment of the invention.

FIG. 3 is a sectional view for illustrating a structure of the display device according to the embodiment of the invention. FIG. 4 is a flow chart for illustrating a manufacture method for the display device according to the embodiment.

A display device 100 according to the embodiment includes an array substrate 10, a counter substrate 20 and a wiring layer ML. The wiring layer ML includes a metal layer M, and a low reflection layer PAR formed of a resin layer abutting on the metal layer M. Similarly to the comparative example, the metal layer M consists of three layers which include the Mo alloy layer M1, the Al alloy layer M2, and the Mo alloy layer M3. It is preferred that at least side surfaces of the metal layer M are covered with a resin layer PL. It is preferred that a resin layer forming the low reflection layer PAR contains a pigment. It is preferred that a resin layer forming the low reflection layer PAR contains a dye.

Next, description is made on the manufacture method for the display device 100 according the embodiment of the invention.

A laminated substrate having the array substrate 10 and the counter substrate 20 bonded together is prepared (Step S11). Subsequently, the metal film is formed on a glass substrate of the counter substrate 20 (Step S12). Next, the metal layer M is formed by patterning the metal film (Step S13). Subsequently, the metal layer M is visually inspected (Step S14). Next, the low reflection layer PAR is formed (Step S15). Finally, a protection layer is formed by forming a protection film as needed (Step S16).

The metal layer used as the wiring layer ML permits the wiring layer ML to be made thinner and further reduced in resistance as compared with the ITO layer. Metallic luster is reduced by forming the low reflection layer PAR, while the thinning processing is effective for minimizing the visible wiring pattern and improving the transmittance. Thus, the display device can satisfy both the electric characteristic (resistance reduction) and the optical characteristic (least visible wiring pattern, higher transmittance). The wiring layer can be improved in the time constant and hence, is applicable to the large, high-resolution panel.

The resin layer used as the low reflection layer PAR permits the low reflection layer PAR to be formed after patterning the metal film. The metal layer M can be visually inspected before forming the low reflection layer PAR. Therefore, the disconnection can be inspected without performing the electrical inspection which requires much time, leading to the significant decrease in productivity.

Further, this method negates the need for collectively etching the low reflection film and the metal film as performed in the comparative example. This also negates the need for setting the etching rate for the metal film higher than that for the low reflection film in order to reduce the metallic luster. Therefore, the risk of disconnection due to the microprocessing and the large amount of metal film retreat can be reduced.

Since the metal layer M is covered with the resin layer PL, the risk of dissolution of the metal layer M can be reduced and the display device can be improved in reliability.

The visual appearance inspection is available if a metal, such as silver, copper and alloys thereof, that can be black-oxide treated is applied to the metal layer and is black-oxide treated after the metal etching. However, there is fear of inducing resistance change because the black oxide treatment is to oxidize a part of metal. The metal that can be black-oxide treated has such a poor adherence to a base material such as glass substrate that an additional adhesion layer is required. Further, such a metal is unfit for microprocessing, exhibiting a large amount of retreat when etched. What is more, such a metal cannot eliminate the risk of dissolution due to migration.

Example

Figure 6:
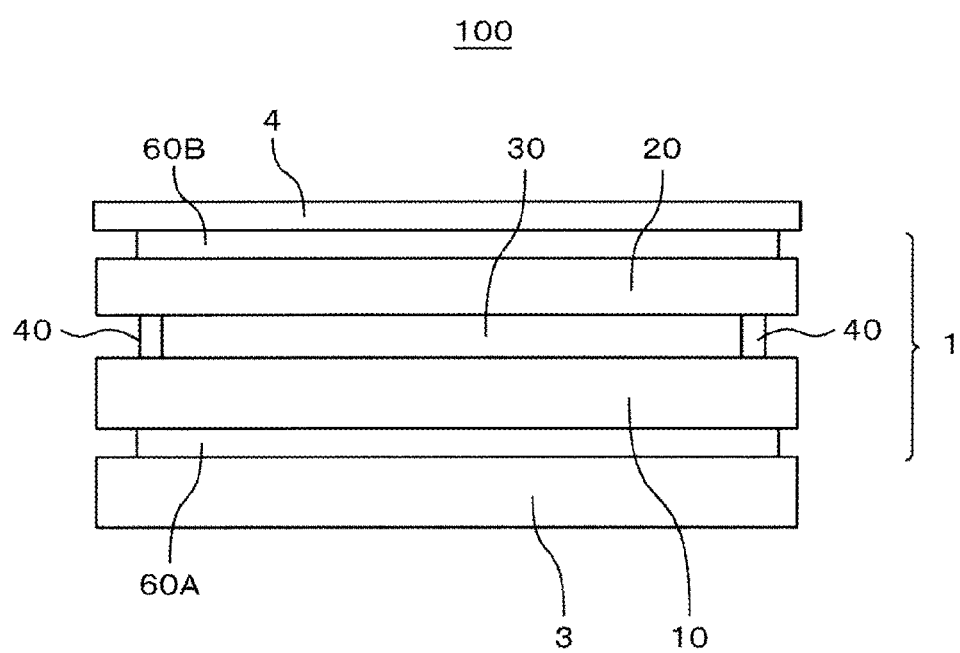
FIG. 6 is a sectional view for illustrating the display device according to the working example of the invention.
Figure 7:
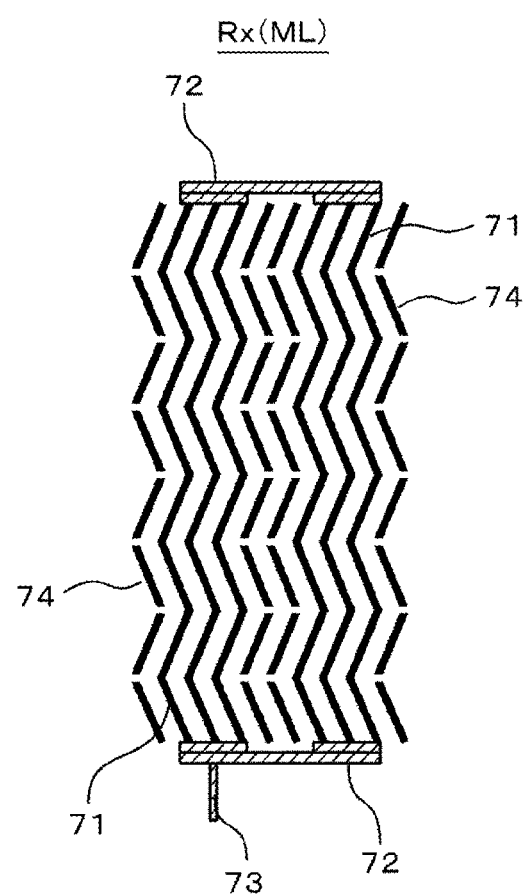
FIG. 7 is a plan view for illustrating a wiring layer of the display device according to the working example of the invention.

A structure of a display device according to a working example of the invention is described with reference to FIG. 5 to FIG. 7.

Figure 5:
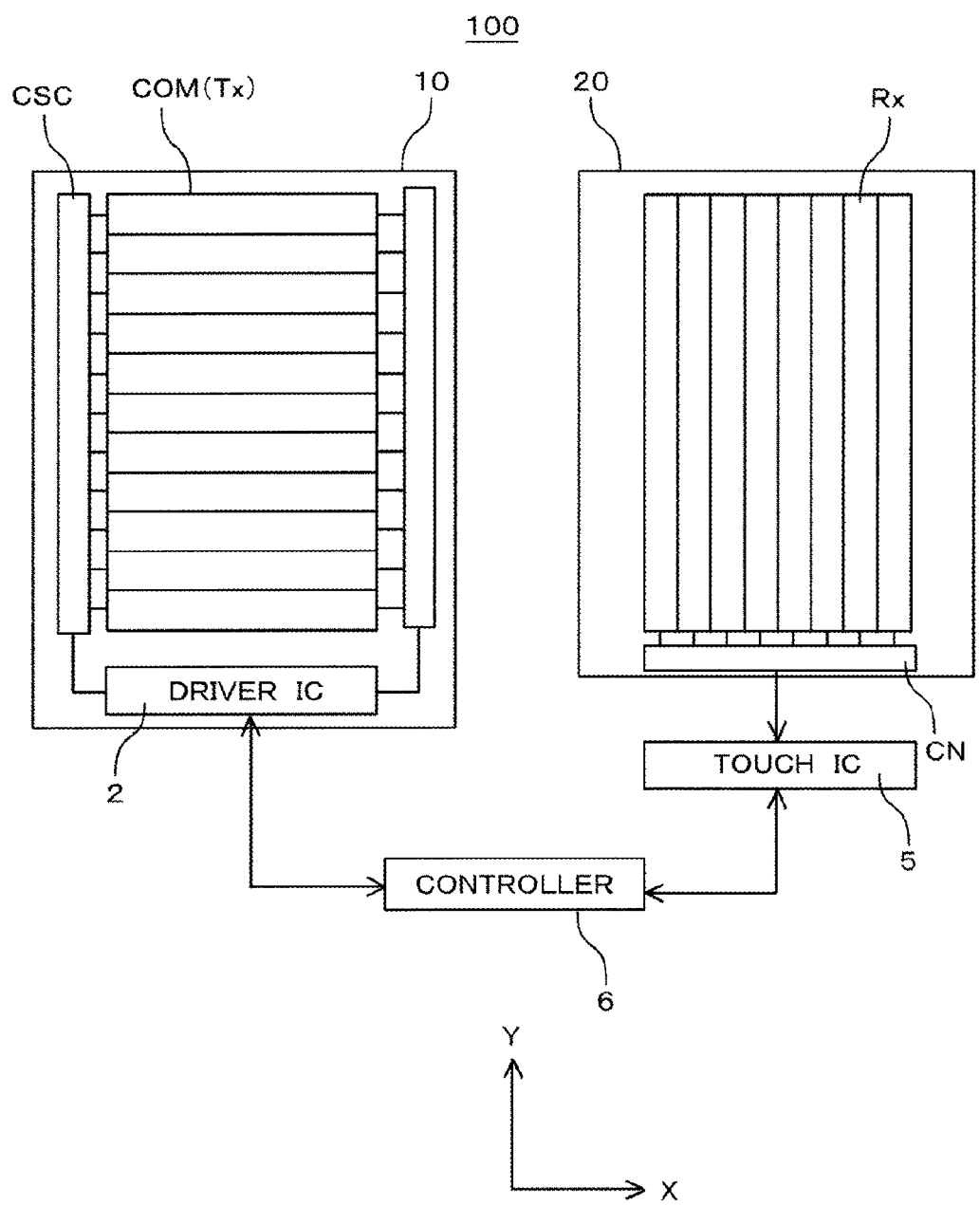
FIG. 5 is a plan view for illustrating a display device according to a working example of the invention.

FIG. 5 is a plan view for illustrating the display device according to the working example. FIG. 6 is a sectional view for illustrating the display device according to the working example. FIG. 7 is a plan view for illustrating a wiring layer of the display device according to the working example.

The display device 100 according to the working example includes a display panel 1, a driver IC 2, a backlight 3, a cover 4, a touch IC 5, and a controller 6. The driver IC 2 and the touch IC 5 are each constituted by a CMOS circuit formed on one silicon substrate. The driver IC 2 is COG (Chip On Glass) mounted on the array substrate 10. The driver IC 2 includes a source drive circuit and performs scanning for display (writing to pixels) and scanning for touch detection by controlling a common scanning circuit CSC and an unillustrated gate scanning circuit. The touch IC 5 includes an integrating circuit, A/D converter circuit, memory, CPU and the like and detects a change in capacitance upon touch input through detection electrodes Rx and a connection part CN. The controller 6 controls the driver IC 2 and the touch IC 5.

The display panel 1 includes the array substrate 10, the counter substrate 20, a liquid crystal 30, a sealing material 40, a polarizing plate 60A and a polarizing plate 60B. The array substrate 10 includes a common electrode COM and a common scanning circuit CSC. The array substrate 10 further includes the glass substrate, pixel electrodes, thin film transistors (TFTs), a gate line scanning circuit and the like which are not shown. The common electrode COM includes a plurality of lines extended in an X-direction and doubles as scanning electrodes Tx for the touch panel. The common scanning circuit CSC is constituted by the TFTs and functions to scan and drive the common electrode COM (scanning electrodes Tx). The counter substrate 20 includes a light shielding layer, a color filter and the like laid on the glass substrate. The liquid crystal 30 is sealed between the array substrate 10 and the counter substrate 20 and between the sealing materials 40. The polarizing plate 60A is disposed between the array substrate 10 and the backlight 3. The polarizing plate 60B is disposed between the counter substrate 20 and the cover 4. The common electrode COM may also be disposed on the counter substrate 20 rather than on the array substrate 10. In this case, as well, the common electrode COM doubles as the scanning electrodes Tx for the touch panel.

The detection electrode Rx (wiring layer ML) for the touch panel is extended in a Y-direction and disposed between the counter substrate 20 and the polarizing plate 60B. A plurality of detection electrodes Rx are formed on the glass substrate of the counter substrate 20. One detection electrode Rx includes: a plurality of thin wiring lines 71; a connecting wire 72 for connecting the thin wiring lines 71 to the counter substrate 20; a lead-out thin wiring line 73 for connection to the connection part CN; and a dummy thin wiring line 74 not contributing to detection. The dummy thin wiring line 74 is not connected to the connecting wire 72. The dummy thin wiring line 74 is provided for optical and mechanical smoothing purposes. It is noted that the thin wiring lines 71 and the dummy thin wiring line 74 are formed in a zigzag pattern to avoid interference with the light shielding layer of the counter substrate 20.

A manufacture method for the display device according to the working example is described with reference to FIG. 8.

Figure 8:
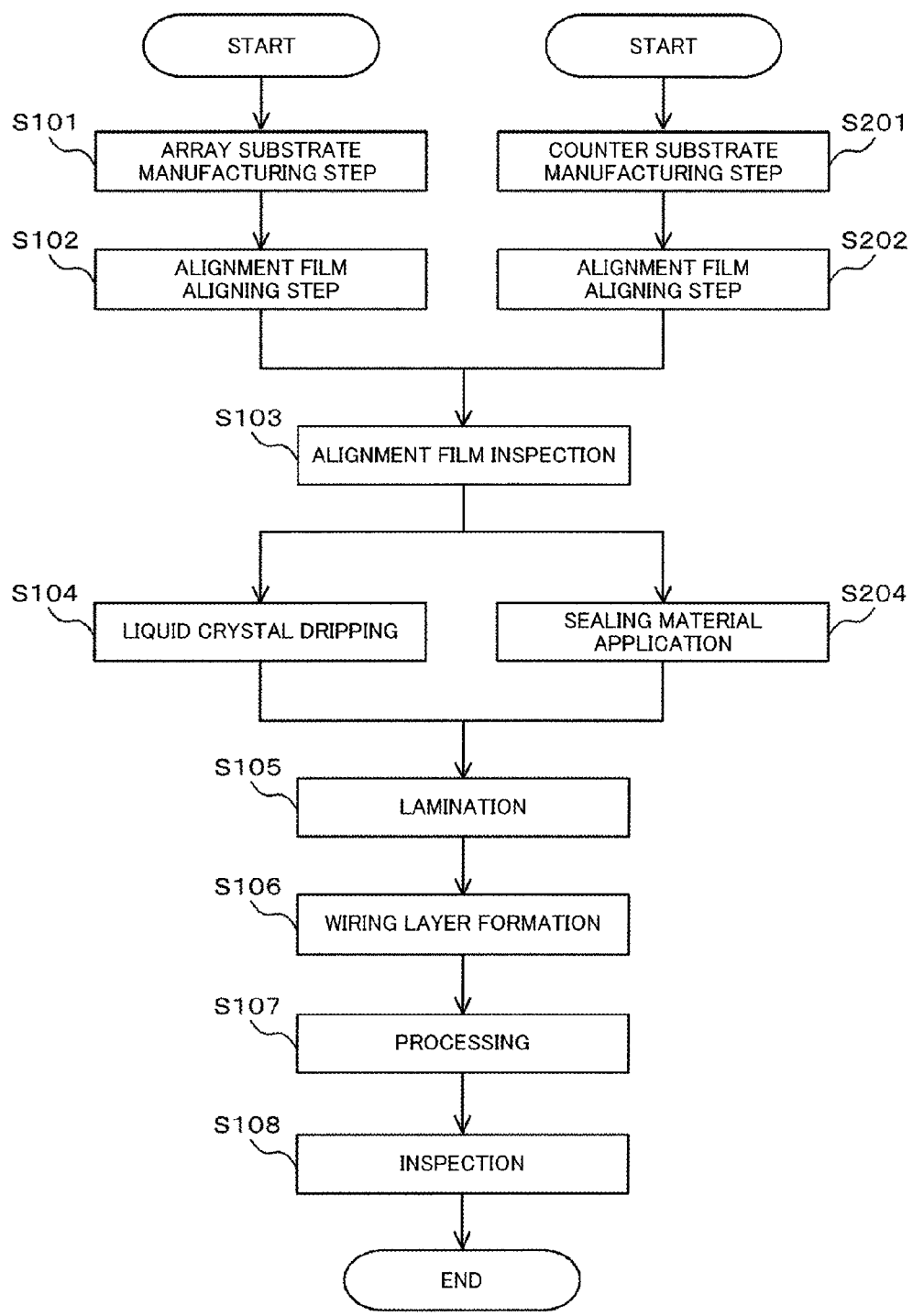
FIG. 8 is a flow chart for illustrating a manufacture method for the display device according to the working example of the invention.

FIG. 8 is a flow chart for illustrating the manufacture method for the display device according to the working example.

A manufacture process for the display device includes: an array substrate manufacturing step for forming driving elements on the array substrate of a lower part; a counter substrate manufacturing step for forming a color filter on the counter substrate of an upper part; and a cell manufacturing step for bonding the array substrate and the counter substrate together.

First, the array substrate manufacturing step is performed to form a plurality of gate lines and a plurality of data lines which are arranged on the lower substrate to define pixel regions, and to form a thin film transistor at each of the pixel regions as the driving element connected to the gate line and the data line (Step S101). Further in the array substrate manufacturing step, pixel electrodes and common electrodes are formed, which are connected to the thin film transistors and operative to drive a liquid crystal layer in response to a signal input via the thin film transistors. In the case of manufacture of a vertical electric field type liquid crystal display device, the common electrodes are formed on the upper substrate formed with the color filter in the counter substrate manufacturing step.

Further in the counter substrate manufacturing step, the light shielding layer and a color filter layer including red, green and blue color filters are formed on the upper substrate (Step S201). Further, spacers for maintaining a consistent cell gap are formed in the counter substrate manufacturing step.

Subsequently, after an alignment film is applied to the upper substrate and the lower substrate, respectively, the alignment films are aligned to impart an alignment regulating force or surface-immobilizing force (namely, pretilt angle and alignment direction) to liquid crystal molecules of the liquid crystal layer formed between the upper substrate and the lower substrate (Steps S102, S202). It is noted here that a rubbing method or an optical alignment method is applicable to the aligning process.

Next, the upper substrate and the lower substrate finished with the alignment film aligning step are subjected to an inspection apparatus for detection of alignment film defect (Step S103).

A predetermined seal pattern is formed of a sealing material on the upper substrate while the liquid crystal layer is formed by dripping liquid crystal onto the lower substrate (Steps S104, S204). According to this dripping method, a dispenser is used to drip and dispense the liquid crystal onto image display regions of a large area first mother substrate (lower substrate) having a plurality of array substrates arranged thereon or of a large area second mother substrate (upper substrate) having a plurality of counter substrates arranged thereon; and a pressure of bonding the first substrate and the second substrate together is used for uniformly distributing the liquid crystal to all of the image display regions so as to form the liquid crystal layer. In the case of forming the liquid crystal layer on the display panel by the dripping method, therefore, the seal pattern is formed in a closed configuration around an outer contour of the image display region in order to prevent the leakage of liquid crystal from the image display region.

The lower substrate with the liquid crystal dripped thereon is in alignment with the upper substrate coated with the sealing material and pressure is applied to the lower and upper substrates so that the lower substrate and the upper substrate are bonded together with the sealing material while the dripped liquid crystal is made to uniformly spread on the whole panel (Step S105). Subsequently, the wiring layer for the detection electrode is formed on the upper substrate (Step S106).

A plurality of display panels formed with the liquid crystal layer are formed on the large area mother substrates (lower substrate and upper substrate) by these steps. The mother substrates are processed and cut into a plurality of display panels (Step S107). Subsequently, the display panel is manufactured by bonding the polarizing plate to the lower substrate and the upper substrate, followed by inspecting each display panel (Step S108).

A manufacture method for the detection electrode wiring (Step S106) is described with reference to FIG. 9 to FIG. 10D.

Figure 9:
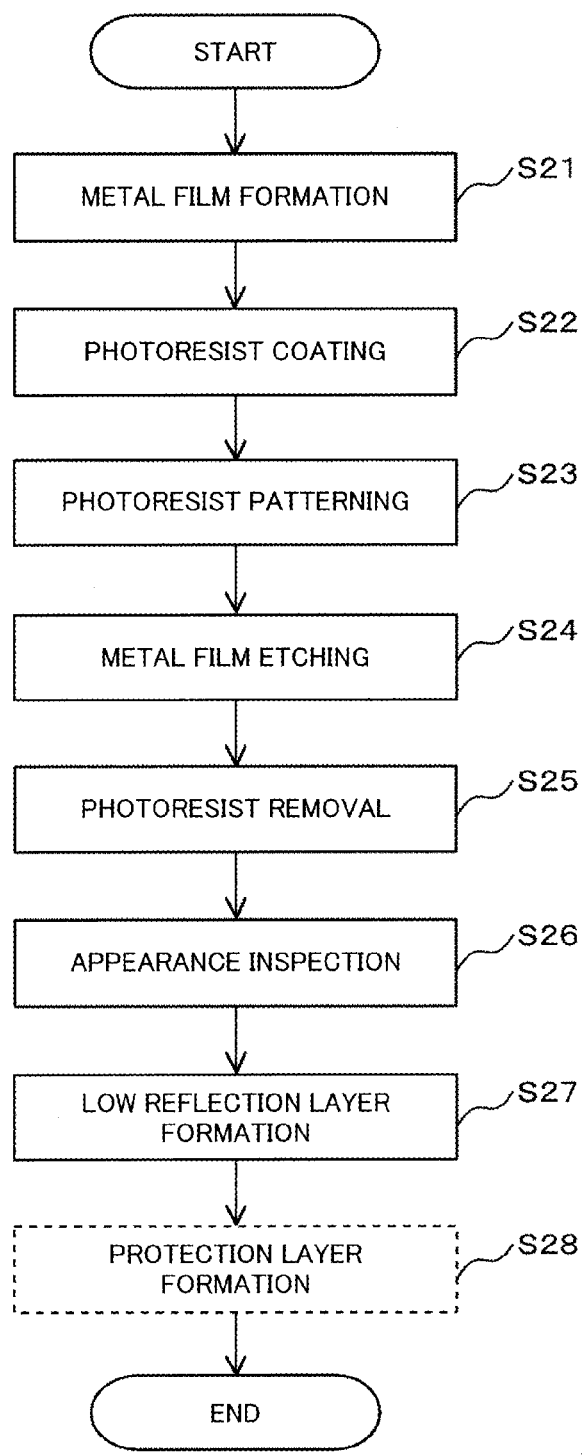
FIG. 9 is a flow chart for illustrating a manufacture method for the display device according to the working example of the invention and a first modification thereof.

FIG. 9 is a flow chart for illustrating the manufacture method for the detection electrode wiring according to the working example. FIG. 10A to FIG. 10D are sectional views for illustrating the manufacture method for the detection electrode wiring according to the working example.

Figure 10A:
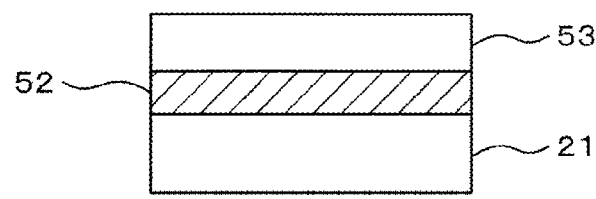
FIG. 10A is a sectional view for illustrating the manufacture method for the display device according to the working example of the invention.

The glass substrate constituting the array substrate 10 and a glass substrate 21 constituting the counter substrate 20 are thinned by etching, followed by cleaning. Next, a metal film 52 is formed on the glass substrate 21 (Step S21). The metal film 52 consists of three layers which include a Mo alloy film M1, an Al alloy film M2, and a Mo alloy film M3. Subsequently, a photoresist 53 is applied onto the metal film 52 (Step S22). The photoresist 53 is a photosensitive transparent resin and functions as an etching protection film. FIG. 10A is a diagram showing a state when the steps S21 and S22 are done.

Figure 10B:
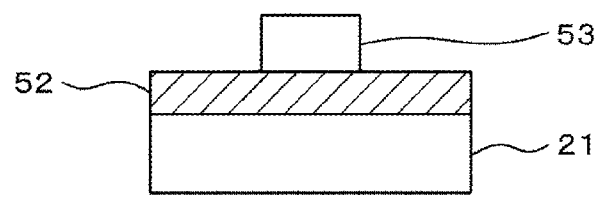
FIG. 10B is a sectional view for illustrating the manufacture method for the display device according to the working example of the invention.

As shown in FIG. 10B, the photoresist 53 is patterned by irradiating the photoresist with light using an unillustrated photomask, followed by developing (Step S23).

Figure 10C:
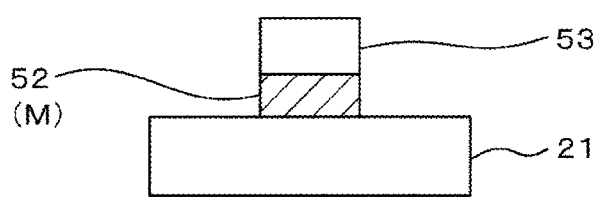
FIG. 10C is a sectional view for illustrating the manufacture method for the display device according to the working example of the invention.

As shown in FIG. 10C, the metal layer M is formed by patterning the metal film 52 which is etched using the photoresist 53 as a mask (Step S24).

Figure 10D:
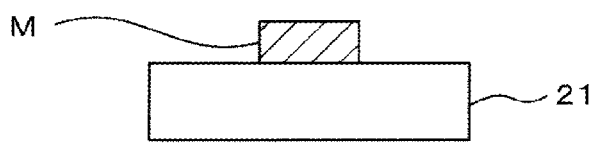
FIG. 10D is a sectional view for illustrating the manufacture method for the display device according to the working example of the invention.

As shown in FIG. 10D, the photoresist is peeled off (removed) (Step S25). The metal layer M is visually inspected (Step S26).

Subsequently, the low reflection layer PAR is formed on the glass substrate 21 and the metal layer M (Step S27). The protection layer PL is formed on the glass substrate 21 and the low reflection layer PAR as needed basis (Step S28).

Next, a method of forming the low reflection layer (Step S27) is described with reference to FIG. 11A to FIG. 11E.

Figure 11A:
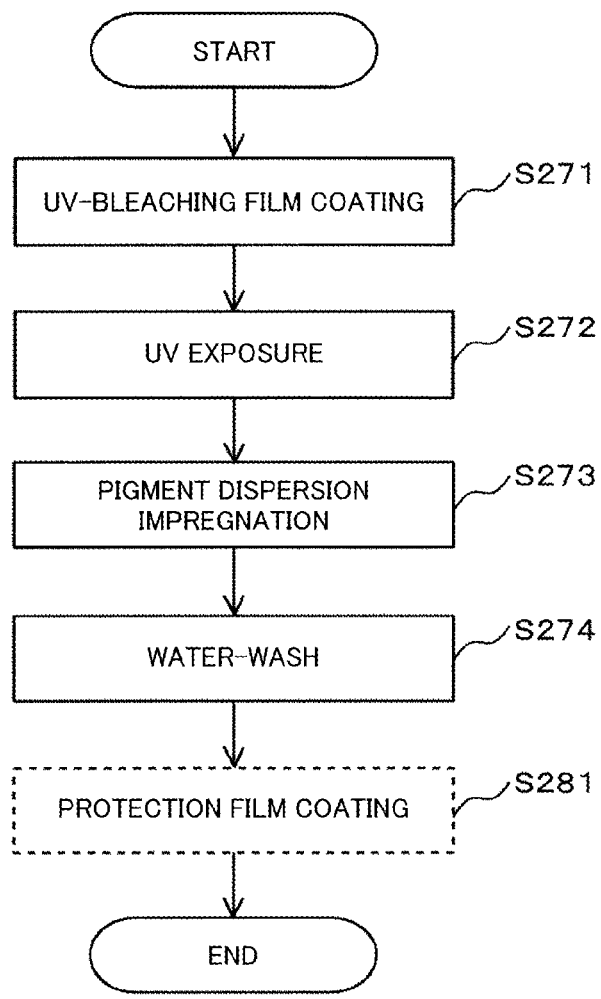
FIG. 11A is a flow chart for illustrating a manufacture method for the display device according to the working example of the invention.

FIG. 11A is a flow chart for illustrating a manufacture method for the low reflection layer of the detection electrode wiring according to the working example. FIG. 11B to FIG. 11E are sectional views for illustrating the manufacture method for the low reflection layer according to the working example.

Figure 11B:
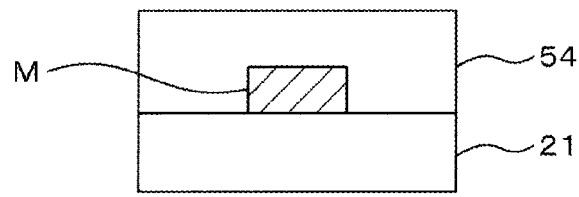
FIG. 11B is a sectional view for illustrating the manufacture method for the display device according to the working example of the invention.

As shown in FIG. 11B, a UV-bleaching film (UV-bleaching material) 54 is applied onto the glass substrate 21 and the metal layer M (Step S271). The UV-bleaching film is formed of an organic polysilane-base material, for example, in which property change is induced by UV irradiation and Si—Si bonds are easily cleaved, permitting impregnation with a pigment dispersion to be described hereinlater. Unless irradiated with a UV light, the UN-bleaching film cannot be impregnated with the pigment dispersion.

Figure 11C:
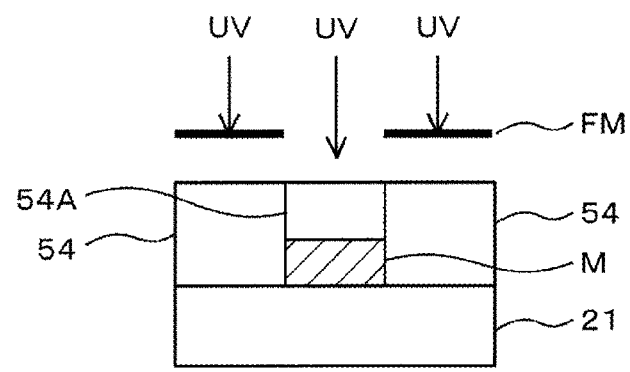
FIG. 11C is a sectional view for illustrating the manufacture method for the display device according to the working example of the invention.

As shown in FIG. 11C, the UV-bleaching film 54 with a photomask FM applied thereto is irradiated with the UV light (Step S272). The irradiated portion of the UV-bleaching film 54 is changed in film property so as to form a resin film 54A.

Figure 11D:
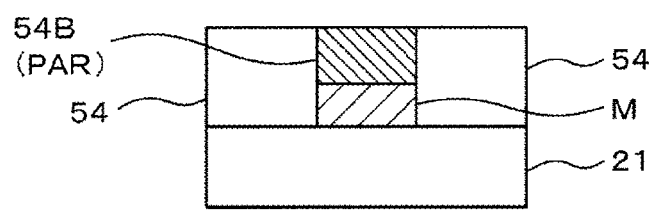
FIG. 11D is a sectional view for illustrating the manufacture method for the display device according to the working example of the invention.
Figure 11E:
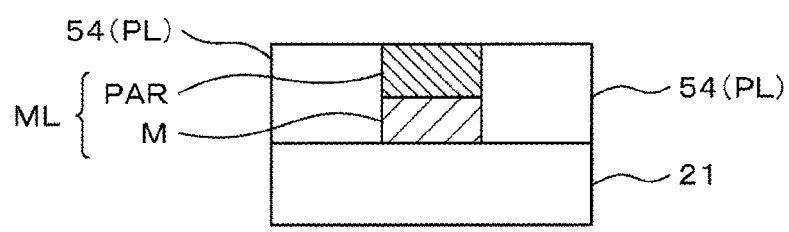
FIG. 11E is a sectional view for illustrating the manufacture method for the display device according to the working example of the invention.

As shown in FIG. 11D, the resin film 54A is impregnated with the pigment dispersion so as to form a low reflection layer 54B (Step S273). The pigment dispersion may be one used for a pigment dispersed resist for color filter. Preferred examples of the pigment include carbon black, black titanium oxide, copper phthalocyanine and the like. The pigment may preferably be black but not limited to this. Any pigment that can lower the reflectivity is usable. As shown in FIG. 11E, the UV-bleaching film 54 (protection layer PL) and the low reflection layer 54B (PAR) are washed with water (Step S274).

Since the metal layer M is covered with the UV-bleaching film 54 and the low reflection layer 54B (PAR) (the UV-bleaching film 54 and the low reflection layer 54B doubling as the protection layer), the protection layer is not required. However, it is also possible to apply an additional protection film to form the protection layer (Step S281).

The metal film, replacing the ITO film, is processed by the same process as that for the ITO film and thereafter, the low reflection layer and the protection layer are formed. In this process, the UV-bleaching film doubles as the protection film such that the UV-irradiated portion can be impregnated with pigment by the photolithographic process. If this UV-bleaching film is applied onto the metal layer, therefore, a layer doubling as the low reflection layer and the protection layer can be formed in one step. Thus, the number of processes can be reduced. Since the low reflection layer is formed after patterning the metal film, the presence of disconnection in the metal layer can be determined by the visual appearance inspection.

The low reflection layer 54B may preferably be formed larger than the metal layer M by a certain degree of margin such that the low reflection layer completely covers the metal layer M as seen from a viewer. Such an approach assuredly prevents the light reflection by the metal layer M even if the low reflection layer 54B and the metal layer M are shifted from a desired overlap position. Thus, the display device can be improved in visibility.

First Modification

A first modification of the manufacture method for the low reflection layer of the detection electrode wiring according to the working example is described with reference to FIG. 12A to FIG. 12E.

Figure 12A:
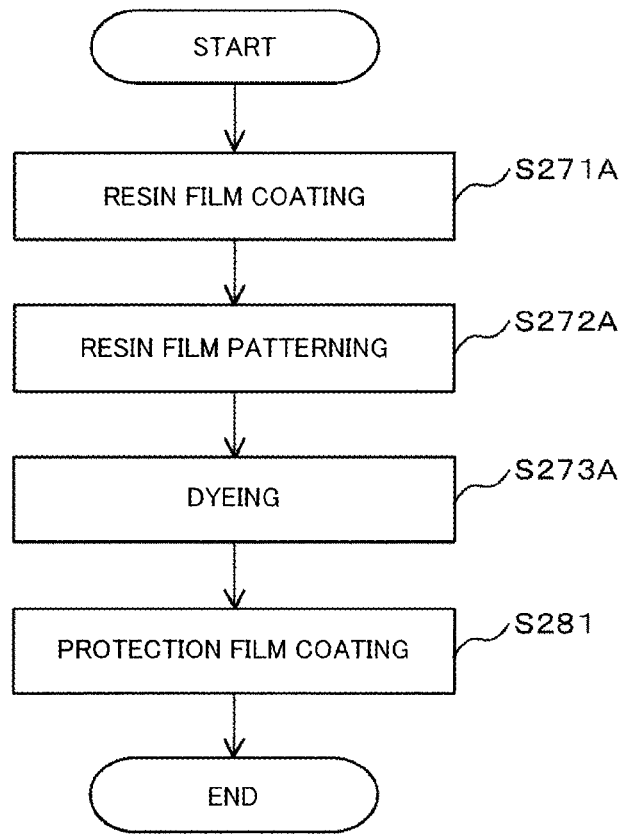
FIG. 12A is a flow chart for illustrating a manufacture method for the display device according to the first modification of the invention.

FIG. 12A is a flow chart for illustrating a manufacture method for the low reflection layer of the detection electrode wiring according to the first modification. FIG. 12B to FIG. 12E are sectional views for illustrating the manufacture method for the low reflection layer of the detection electrode wiring according to the first modification.

This method includes the steps of: applying a resin film such as formed of an acrylic resin in place of the UV-bleaching film of the working example; and forming the low reflection layer by dyeing the resin film with a dyeing liquid for plastics. The manufacture method according to the first modification includes the same steps with the steps S21 to S26 of the manufacture method for the detection electrode wiring according to the working example.

Figure 12B:
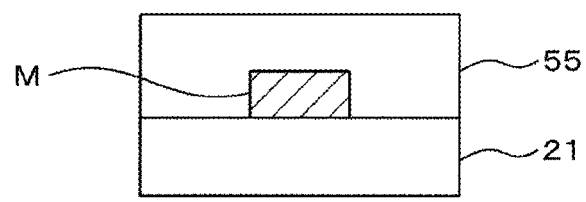
FIG. 12B is a sectional view for illustrating the manufacture method for the display device according to the first modification of the invention.

As shown in FIG. 12B, a resin film 55 is applied onto the glass substrate 21 and the metal layer M (Step S271A). The resin film 55 is an acrylic resin film, for example.

Figure 12C:
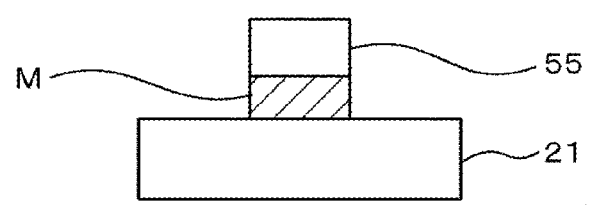
FIG. 12C is a sectional view for illustrating the manufacture method for the display device according to the first modification of the invention.

As shown in FIG. 12C, the resin film 55 is patterned by irradiating the resin film 55 with the UV light using an unillustrated photomask, followed by developing (Step S272A).

Figure 12D:
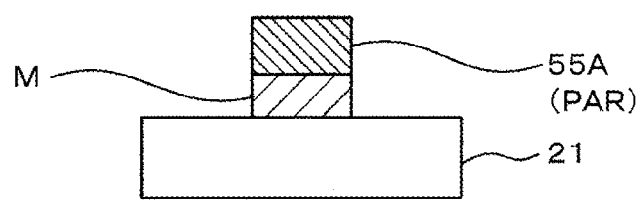
FIG. 12D is a sectional view for illustrating the manufacture method for the display device according to the first modification of the invention.

As shown in FIG. 12D, a low reflection layer 55A (PAR) is formed by impregnating the resin film 55 with a dye (Step S273A). An example of the usable dye is a general-purpose dyeing liquid for plastics. The dye may preferably be black but not limited to this. Any dye that lowers the reflectivity is usable.

Figure 12E:
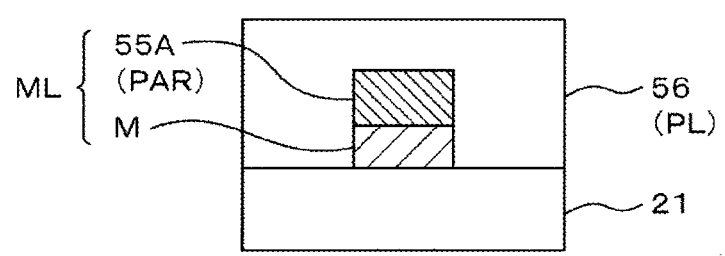
FIG. 12E is a sectional view for illustrating the manufacture method for the display device according to the first modification of the invention.

As shown in FIG. 12E, the protection layer PL is formed by applying a transparent and colorless resin film 56 to an upper surface of the glass substrate 21, side surfaces of the metal layer M and an upper surface of the low reflection layer 55A (PAR) (Step S281). The resin film 56 is an acrylic resin film, for example.

Although the first modification requires the protection layer, the first modification can provide the same effect as the working example without using a special film called the UV-bleaching film.

Second Modification

A second modification of the manufacture method for the detection electrode wiring (Step S106) is described with reference to FIG. 13 to FIG. 14C.

Figure 13:
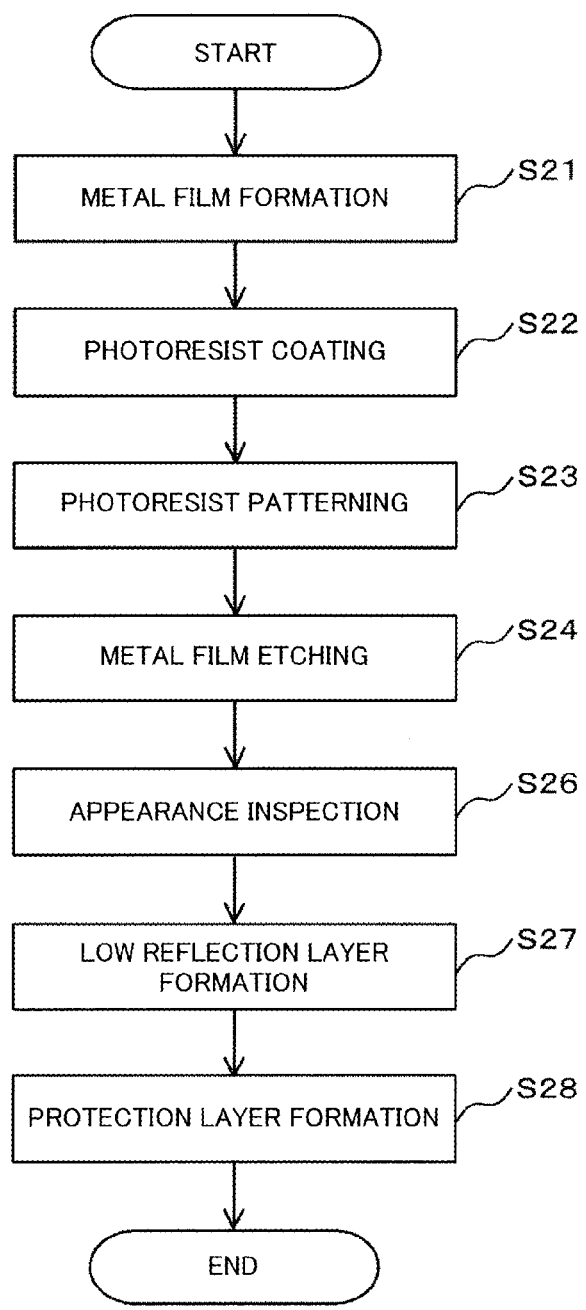
FIG. 13 is a flow chart for illustrating a manufacture method for display devices according to second and third modifications of the invention.
Figure 14A:
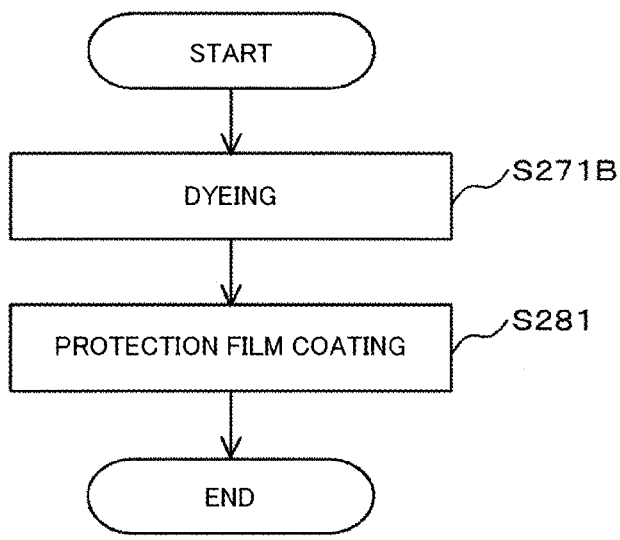
FIG. 14A is a flow chart for illustrating the manufacture method for the display device according to the second modification of the invention.
Figure 14B:
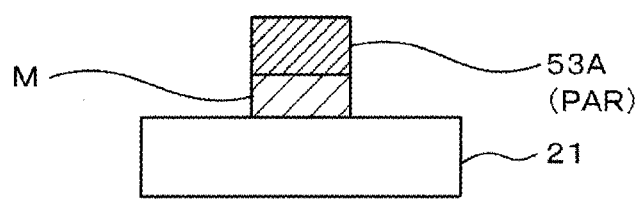
FIG. 14B is a sectional view for illustrating the manufacture method for display device according to the second modification of the invention.

FIG. 13 is a flow chart for illustrating a manufacture method for the detection electrode wiring according to the second modification. FIG. 14A is a flow chart for illustrating a manufacture method for a low reflection layer of the detection electrode wiring according to the second modification. FIG. 14B and FIG. 14C are sectional views for illustrating the manufacture method for the low reflection layer according to the second modification.

The manufacture method for the detection electrode wiring according to the second modification differs from that of the working example in that the photoresist for metal film patterning (etching protection film) is not removed but used as the low reflection layer. The manufacture method according to the second modification includes the same steps with the steps S21 to S26 of the manufacture method for the detection electrode wiring according to the working example. The photoresist is not a light shielding film but is transparent and hence, the metal layer can be visually inspected through the photoresist.

As shown in FIG. 14B, the photoresist 53 is impregnated with a dye to form a low reflection layer 53A (PAR) (Step S271B).

Figure 14C:
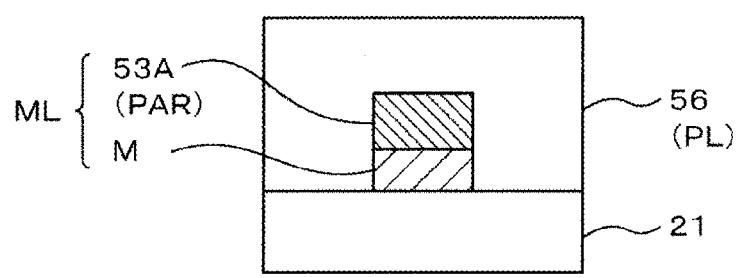
FIG. 14C is a sectional view for illustrating the manufacture method for the display device according to the second modification of the invention.

As shown in FIG. 14C, the protection layer PL is formed by applying the transparent and colorless resin film 56 to the upper surface of the glass substrate 21, the side surfaces of the metal layer M and an upper surface of the low reflection layer 53A (PAR) (Step S281).

Although the second modification requires the protection layer, the second modification can provide the same effect as the working example without using the UV-bleaching film 54 of the working example or performing the step of applying and processing the resin film 55 by the first modification.

Third Modification

A third modification of the manufacture method for the low reflection layer of the detection electrode wiring according to the working example is described with reference to FIG. 15A and FIG. 15B.

Figure 15A:
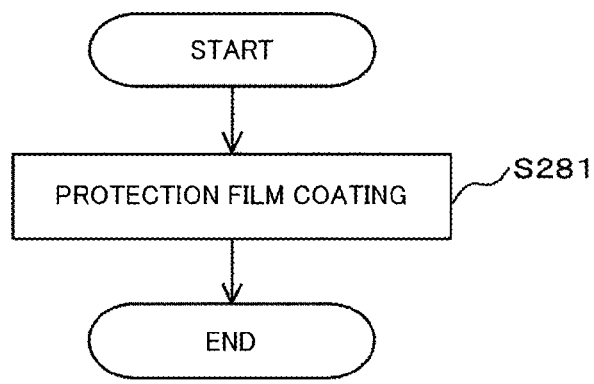
FIG. 15A is a flow chart for illustrating a manufacture method for the display device according to the third modification of the invention.

FIG. 15A is a flow chart for illustrating a manufacture method for a low reflection layer of the detection electrode wiring according to the third modification. FIG. 15B is a sectional view for illustrating the manufacture method for the low reflection layer according to the third modification.

The manufacture method for the low reflection layer of the detection electrode wiring according to the third modification differs from that of the second modification in that the photoresist per se is used as the low reflection layer without being dyed. The manufacture method according to the third modification includes the same steps with the steps S21 to S26 of the manufacture method for the detection electrode wiring according to the working example. Similarly to the second modification, the photoresist is not a light shielding film but is transparent and hence, the metal layer can be visually inspected through the photoresist.

Figure 15B:
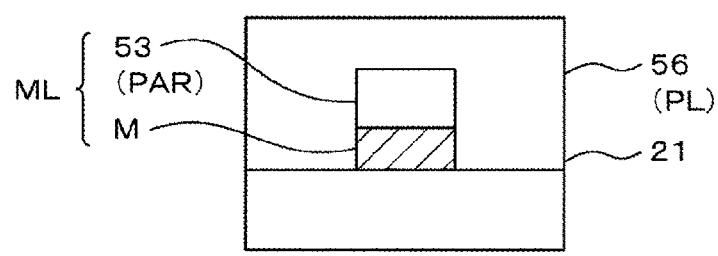
FIG. 15B is a sectional view for illustrating the manufacture method for the display device according to the third modification of the invention.

As shown in FIG. 15B, the protection layer PL is formed by applying the transparent and colorless resin film 56 to the upper surface of the glass substrate 21, the side surfaces of the metal layer M and an upper surface of the photoresist 53 (low reflection layer) (Step S281).

Although the third modification requires the protection layer, the third modification obviates the need for the UV-bleaching film 54 of the working example, the step of applying and processing the resin film 55 in the first modification, and the step of dyeing the photoresist 53 in the second modification. Although the photoresist 53 is transparent, the photoresist (having a function of the low reflection layer) can reduce more reflection from the metal layer than in a case where the photoresist 53 is not applied.

It is also preferred in the first to third modifications that the low reflection layer is formed larger than the metal layer M by a certain degree of margin such that the low reflection layer completely covers the metal layer M as seen from the viewer. Such an approach assuredly prevents the light reflection by the metal layer M even if the low reflection layer and the metal layer M are shifted from the desired overlap position. Thus, the display device can be improved in visibility.

In the display devices and the manufacture methods thereof according to the working example and the first to third modifications, the presence of electric property abnormalities such as disconnection due to processing risk can be determined by an automatic appearance inspection based on image processing. Further, the display devices and the manufacture methods according to the working example and the first to third modifications permit the use of pigment dispersion for use in the pigment dispersed resist for color filter and the like, or the use of the general-purpose dyeing liquid for plastics. The display devices of the working example and the first to third modification are rich in color variations and feature a low reflection property and easy toning. Hence, a color toning property can also be added to those display devices.

What is claimed is:

1. A display device comprising:
an array substrate; and
a counter substrate including a light shielding layer,
wherein the array substrate comprises:
display pixel electrodes; and
scanning electrodes for touch panel extended in a first direction,
the counter substrate comprises:
a substrate having an first surface opposed to the array substrate, and a second surface on the opposite side from the first surface; and
detection electrodes for touch panel extended in a second direction different from the first direction,
one detection electrode of the detection electrodes comprises:
a metal layer disposed on the second surface of the substrate: and
a low reflection layer disposed on the metal layer,
the metal layer contains an aluminum alloy,
the low reflection layer is formed of an UV-bleaching resin, which becomes able to be impregnated with a pigment dispersed by irradiation of UV light, and
the one detection electrode is formed in a zigzag pattern.

2. The display device according to claim 1, wherein the low reflection layer contains a pigment.

3. The display device according to claim 2, further comprising a resin layer covering side surfaces of the metal layer.

4. The display device according to claim 1, wherein the low reflection layer contains a dye.

5. The display device according to claim 4, further comprising a protection layer for covering the metal layer and the low reflection layer.

6. The display device according to claim 1, further comprising a protection layer for covering the metal layer and the low reflection layer.

* * * * *